United States Patent
Kartschoke et al.

(10) Patent No.: US 7,127,689 B2
(45) Date of Patent: Oct. 24, 2006

(54) METHOD FOR PREVENTING CIRCUIT FAILURES DUE TO GATE OXIDE LEAKAGE

(75) Inventors: Paul D. Kartschoke, Williston, VT (US); Thomas G. Mitchell, Essex Junction, VT (US); Norman J. Rohrer, Underhill, VT (US); Ronald D. Rose, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 251 days.

(21) Appl. No.: 10/709,798

(22) Filed: May 28, 2004

(65) Prior Publication Data
US 2005/0278662 A1 Dec. 15, 2005

(51) Int. Cl.
*G06F 17/50* (2006.01)
(52) U.S. Cl. ....................................... 716/5
(58) Field of Classification Search .................... 716/5, 716/4
See application file for complete search history.

(56) References Cited

U.S. PATENT DOCUMENTS

| | | | | |
|---|---|---|---|---|
| 5,822,218 A | * | 10/1998 | Moosa et al. | 716/4 |
| 6,222,770 B1 | * | 4/2001 | Roohparvar | 365/185.19 |
| 6,378,109 B1 | * | 4/2002 | Young et al. | 716/4 |
| 2002/0027391 A1 | * | 3/2002 | Hutamura et al. | 307/130 |
| 2004/0160239 A1 | * | 8/2004 | Reynick | 324/765 |
| 2005/0007153 A1 | * | 1/2005 | Ding et al. | 326/98 |
| 2005/0218934 A1 | * | 10/2005 | Lee et al. | 326/83 |

OTHER PUBLICATIONS

R, Rodriquez-Montanes, J.A. Segura, V.H. Champac, J. Figueras and J.A. Rubio, Current vs. logic testing of gate oxide short floating gate bridging failures in CMOS, Proc. Int. Test Conf., pp. 510-519, Oct. 1991.*

* cited by examiner

*Primary Examiner*—Paul Dinh
*Assistant Examiner*—Suchin Parihar
(74) *Attorney, Agent, or Firm*—Scully, Scott, Murphy & Presser, P.C.; Michael J. LeStrange, Esq

(57) ABSTRACT

A method is disclosed for preventing circuit failures due to gate oxide leakage, and is used to efficiently check many nets of a circuit on a chip or within a macro to find logical fails due to gate oxide leakage using DC calculations, wherein the gate leakage is treated as a noise source for a static noise analysis of the circuit.

20 Claims, 2 Drawing Sheets

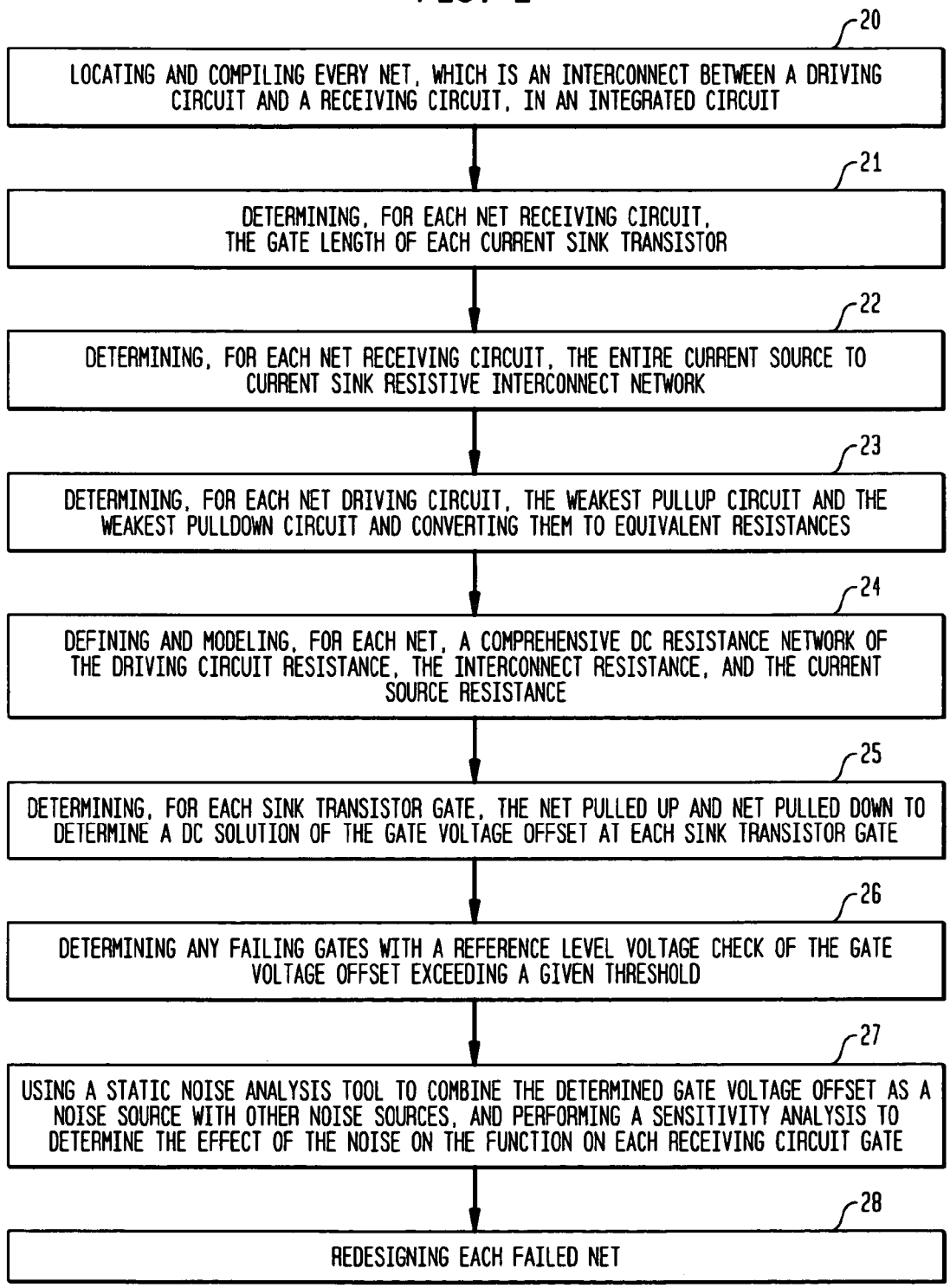

METHOD FOR PREVENTING CIRCUIT FAILURES DUE TO GATE OXIDE LEAKAGE

BACKGROUND OF INVENTION

1. Field of the Invention

The present invention relates generally to a method for preventing circuit failures due to gate oxide leakage, and more particularly pertains to a methodology for efficiently checking many nets of a circuit on a chip or within a macro to find logical fails due to gate oxide leakage using DC calculations, wherein the gate leakage is treated as a noise source in a static noise analysis of the circuit.

2. Discussion of the Prior Art

As gate oxides on field effect transistors (FETs) have scaled to thinner dimensions, the occurrence of gate tunneling current due to gate oxide leakage has become more prevalent. Circuits with a large fanout (feeding and serving as an input to many downstream circuits) or with a large series resistance may not be able to provide a sufficiently large gate current at each receiving circuit and can cause an increase in crossover current and possibly a fail.

SUMMARY OF INVENTION

Accordingly, it is a primary object of the present invention to provide a method for preventing circuit failures due to gate oxide leakage. More particularly, the subject invention pertains to a methodology for efficiently checking many nets of a circuit on a chip or within a macro to find logical fails due to gate oxide leakage using DC calculations, wherein the gate leakage is treated as a noise source for a static noise analysis of the circuit.

BRIEF DESCRIPTION OF DRAWINGS

The foregoing objects and advantages of the present invention for a method for preventing circuit failures due to gate oxide leakage may be more readily understood by one skilled in the art with reference being had to the following detailed description of several embodiments thereof, taken in conjunction with the accompanying drawings wherein like elements are designated by identical reference numerals throughout the several views, and in which:

FIG. 2 is process flow diagram of the sequential method steps of the present invention for locating logical circuit fails in a circuit such as is illustrated in FIG. 1 due to gate oxide leakage with DC calculations.

DETAILED DESCRIPTION

Figure 1:
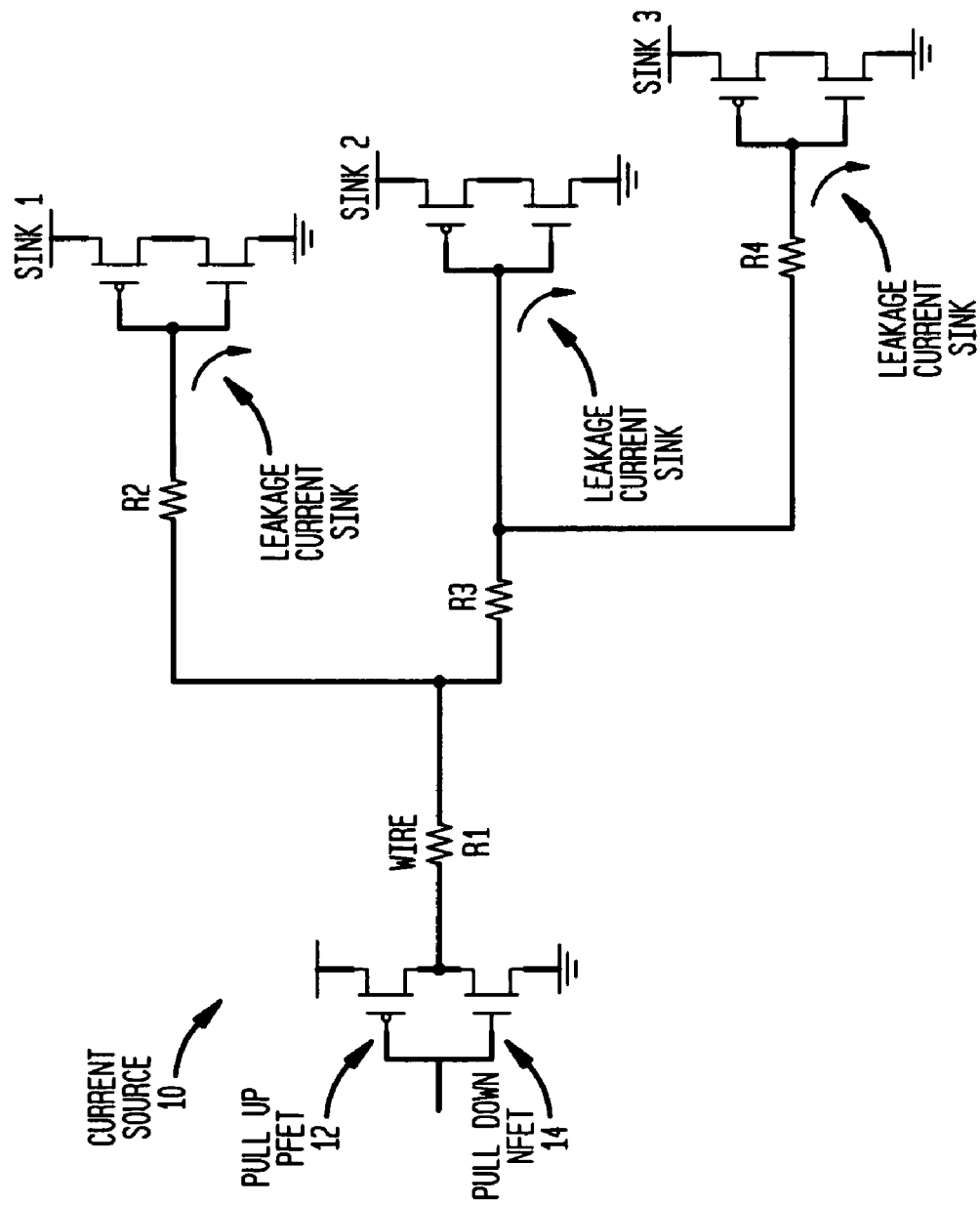
FIG. 1 illustrates a typical circuit on a chip or in a macro wherein a driving circuit fans out to a large number of gates of receiving circuits, such that the fan out leads to a reduction in the voltage level produced at the input to each receiving circuit.

For every Angstrom of decrease in gate oxide thickness in transistor devices, the tunneling current in the transistor devices has increased by approximately 2.7 times. 90 nm node technologies have a thickness of oxide (Tox) of approximately 10.5 Angstroms. A 65 nm node technology is expected to have a Tox near 8 Angstroms.

A small driving circuit may fan out to a large number of gates (serve as an input to the gates of many downstream circuits), whereby the cumulative gate current can possibly overwhelm the small driving circuit. This fan out leads to a reduction in the voltage level produced at the input to each receiving circuit, and at best is recognized as a weak level and causes additional crossover current. In more severe cases, the gate current can overwhelm the driving circuit and fail to provide a sufficiently strong gate current to be recognized as a valid input logical signal and fail to propagate the logical signal.

A second failure mode exists as well. In this scenario, the driving circuit is sufficiently large, but the wiring resistance of the interconnect net between the driving circuit output and the gate of the receiving circuit is large. With a large tunneling current, the IR voltage drop on the interconnect net can be too large and create a weak signal at the gate of the receiving circuit. Again, this could be a power drain or result in a complete failure to propagate the logical signal.

No known technique exists in the present state of the art for analyzing this effect at a chip level.

FIG. 1 illustrates a typical circuit on a chip or in a macro wherein a current source circuit 10 fans out to a large number of gates of receiving circuits, sink circuit 1, sink circuit 2, and sink circuit 3, such that the fan out leads to a reduction in the voltage level produced at the input to each receiving circuit. The current source circuit 10 typically includes a pull up PFET device 12, and a pull down NFET device 14. The current source circuit 10 is connected by series interconnect nets, shown by schematic resistances R1 and R2 experiencing voltage drops IR1 and IR2, to sink circuit 1 which includes a leakage current sink, and is connected by series interconnect nets, shown by schematic resistances R1 and R3 experiencing voltage drops IR1 and IR3, to sink circuit 2 which also includes a leakage current sink, and is connected by series interconnect nets, shown by schematic resistances R1, R3 and R4 experiencing voltage drops IR1 and IR3 and IR4, to sink circuit 3 which also includes a leakage current sink.

The present invention provides a method for identifying and preventing logic errors in an integrated circuit caused by gate oxide leakage, comprising the following steps.

1. locate and compile every net (wire interconnect between a driving circuit and a receiving circuit) in an integrated circuit on a chip or within a macro.

2. determine the gate area of each current sink transistor (generally an nFET) in each receiving circuit which typically also includes a current source transistor (generally a pFET). This can be determined by finding the gate input capacitance load of each current sink transistor and converting it to a current sink or current source having a gate area proportional to the size of the gate input capacitance. Alternatively, a better and more accurate approach is to start with the actual dimensions of each current sink transistor/receiving circuit.

3. determine the entire current source to current sink resistive interconnect network for each net.

4. determine the weakest driving circuit pull-up circuit and the weakest driving circuit pull-down circuit and convert them to equivalent resistances.

5. define and model, for each net, a DC resistance network of the driving circuit resistance, the interconnect resistance and the current source resistance. This could include, for improved modeling in the DC network, an interconnect resistance parameter for each sink transistor that is measured from the input pin to the current source gate;

6. use Power Spice (or an equivalent Spice simulator or Spice-approximate simulator—a program that simulates the operation of transistors within a circuit by simultaneously solving a plurality of equations at once to determine voltage and current characteristics of the circuit) to simulate the net pulled up and net pulled down to determine a DC solution of the gate voltage offset at each sink transistor gate, which is the offset or difference of the sink transistor gate voltage from its normal voltage (e.g. Vdd or ground), typically caused by noise, for each simulation. This step can include simulating a transition for each of the pull-up and pull-down networks to determine a DC solution of the gate voltage offset at each sink gate for each such simulated transition.

7. flag/determine failing gates with a simple predetermined reference level voltage check. For example, the gate offset voltage exceeding 10% of the power supply voltage Vdd while providing some design margin. The limit for any net is at least the unity gain point of the sink transistor gate, such that in the step of determining any failing gates with a reference level voltage check, a passing value corresponds to at least a unity gain of the sink transistor gate.

8. include the determined gate voltage offset as a noise source to a static noise analysis tool, where it is combined with other noise sources, such as noise induced by capacitive coupling between adjacent signal lines, and perform a sensitivity analysis to determine the effect of the noise on the function on each receiving circuit gate.

9. redesign/improve each failed nets through electrical and logical optimization, such as providing wiring interconnect with lower resistance, a larger source driver, smaller fanout, or by inserting additional buffers.

FIG. 2 is a process flow diagram of the sequential method steps of the present invention for identifying and preventing logical circuit fails or errors in an integrated circuit, such as illustrated schematically in FIG. 1, due to gate oxide leakage with DC calculations and used to check wires on a chip. Referring to FIG. 2, the method comprises the sequential steps of: at 20 locating and compiling every net, which is an interconnect between a driving circuit and a receiving circuit, in an integrated circuit; at 21 determining, for each net receiving circuit, the gate length of each current sink transistor; at 22 determining, for each net receiving circuit, the entire current source to current sink resistive interconnect network; at 23 determining, for each net driving circuit, the weakest pull-up circuit and the weakest pull-down circuit and converting them to equivalent resistances; at 24 defining and modeling, for each net, a comprehensive DC resistance network of the driving circuit resistance, the interconnect resistance, and the current source resistance; at 25 determining, for each sink transistor gate, the net pulled up and net pulled down to determine a DC solution of the gate voltage offset at each sink transistor gate; at 26 determining any failing gates with a reference level voltage check of the gate voltage offset exceeding a given threshold; at 27 using a static noise analysis tool to combine the determined gate voltage offset as a noise source with other noise sources, and performing a sensitivity analysis to determine the effect of the noise on the function on each receiving circuit gate; and at 28 redesigning each failed net.

The above methodology could be improved by providing more detailed information about each receiving circuit to obtain a more accurate description of the leakage current. Each input pin could be used to measure/pass the resistance of the wire to each gate along with the gate area of the NFETs and PFETs. This would allow a more accurate calculation of the final leakage current and of the final DC resistance network.

The present invention can provide an enhancement to a computer aided design(CAD) tool.

While several embodiments and variations of the present invention for a method for preventing circuit failures due to gate oxide leakage are described in detail herein, it should be apparent that the disclosure and teachings of the present invention will suggest many alternative designs to those skilled in the art.

The invention claimed is:

1. A method for identifying and preventing logic errors in an integrated circuit caused by gate oxide leakage, comprising:
locating and compiling every net, which is an interconnect between a driving circuit and a receiving circuit, in an integrated circuit;
determining, for each receiving circuit, the gate length of each current sink transistor device;
determining, for each receiving circuit, the entire current source to current sink resistive interconnect network;
determining, for each driving circuit, the weakest pullup circuit and the weakest pulldown circuit and converting them to equivalent resistances;
defining and modeling, for each net, a comprehensive DC resistance network of the driving circuit resistance, the interconnect resistance, and the current source resistance;
determining, for each sink transistor gate, the net pulled up and net pulled down to determine a DC solution of the gate voltage offset at each sink transistor gate;
determining any failing gates with a reference level voltage check of the gate voltage offset relative to a given threshold;
using a static noise analysis tool to combine the determined gate voltage offset as a noise source with other noise sources, and performing a sensitivity analysis to determine the effect of the noise on the function on each receiving circuit gate;
redesigning each failed net.

2. The method of claim 1, wherein the step of compiling includes compiling a list of nets in an integrated circuit in a chip or within a macro.

3. The method of claim 1, wherein the step of determining the gate length of each current sink transistor device includes determining the actual device dimensions of each current sink transistor.

4. The method of claim 1, wherein the step of determining the gate length of each current sink transistor device includes determining a gate capacitance load on each current sink transistor device, and converting the gate capacitance load to a current sink or current source relative to the size of the input capacitance.

5. The method of claim 1, wherein the step of determining failing gates uses an offset exceeding a given percentage of power supply voltage.

6. The method of claim 1, wherein the step of determining failing gates uses an offset exceeding a given percentage of power supply voltage, and the limit for any net is at least the unity gain point of the current sink gate.

7. The method of claim 6, wherein the step of redesigning failed nets includes redesigning each failed net through electrical and logical optimization, including providing a wiring interconnect with a lower resistance, or a larger driver, or a smaller fanout, or by inserting additional buffers.

8. The method of claim 1, wherein the step of defining and modeling, for each net, a comprehensive DC resistance network includes, for improved modeling in the DC network, an interconnect resistance parameter for each sink transistor that is measured from an input pin to the current source gate.

9. The method of claim 1, wherein the step of determining, for each sink transistor gate, the net pulled up and net pulled down includes simulating a transition for each pullup and pulldown network to determine a DC solution of the gate voltage offset at each sink gate for each simulated transition.

10. The method of claim 1, wherein the step of determining any failing gates with a reference level voltage check, a passing value corresponds to at least a unity gain of a sink gate.

11. A method for identifying and preventing logic errors in an integrated circuit caused by gate oxide leakage, comprising:
defining every net, which is an interconnect between a driving circuit and a receiving circuit, in an integrated circuit;
determining, for each receiving circuit, the gate length of each current sink transistor device;
determining, for each receiving circuit, the entire current source to current sink resistive interconnect network;
determining, for each driving circuit, the weakest pullup circuit and the weakest pulldown circuit and converting them to equivalent resistances;
defining a model, for each net, of a comprehensive DC resistance network of the driving circuit resistance, the interconnect resistance, and the current source resistance;
determining, for each sink transistor gate, the net pulled up and net pulled down to determine a DC solution of the gate voltage offset at each sink transistor gate;
determining any failing gates with a reference level voltage check of the gate voltage offset relative to a given threshold;
combining the determined gate voltage offset as a noise source with other noise sources while performing a sensitivity analysis to determine the effect of the noise on the function on each receiving circuit gate;
redesigning each failed net.

12. The method of claim 11, wherein the step of defining every net includes compiling a list of nets in an integrated circuit in a chip or within a macro.

13. The method of claim 11, wherein the step of determining the gate length of each current sink transistor device includes determining the actual device dimensions of each current sink transistor.

14. The method of claim 11, wherein the step of determining the gate length of each current sink transistor device includes determining a gate capacitance load on each current sink transistor device, and converting the gate capacitance load to a current sink or current source relative to the size of the input capacitance.

15. The method of claim 11, wherein the step of determining failing gates uses an offset exceeding a given percentage of power supply voltage.

16. The method of claim 11, wherein the step of determining failing gates uses an offset exceeding a given percentage of power supply voltage, and the limit for any net is at least the unity gain point of the current sink gate.

17. The method of claim 16, wherein the step of redesigning failed nets includes redesigning each failed net through electrical and logical optimization, including providing a wiring interconnect with a lower resistance, or a larger driver, or a smaller fanout, or by inserting additional buffers.

18. The method of claim 11, wherein the step of defining and modeling, for each net, a comprehensive DC resistance network includes, for improved modeling in the DC network, an interconnect resistance parameter for each sink transistor that is measured from an input pin to the current source gate.

19. The method of claim 11, wherein the step of determining, for each sink transistor gate, the net pulled up and net pulled down includes simulating a transition for each pullup and pulldown network to determine a DC solution of the gate voltage offset at each sink gate for each simulated transition.

20. The method of claim 11, wherein the step of determining any failing gates with a reference level voltage check, a passing value corresponds to at least a unity gain of a sink gate.

* * * * *